United States Patent [19]
Drews et al.

[11] Patent Number: 4,877,989

[45] Date of Patent: Oct. 31, 1989

[54] ULTRASONIC POCKET ATOMIZER

[75] Inventors: Wolf-Dietrich Drews, Lichtenfels; Klaus Van Der Linden, Kronach; Martin Rüttel, Grub a. Forst; Jürgen Friedrich, Neuensorg, all of Fed. Rep. of Germany

[73] Assignee: Siemens Aktiengesellschaft, Munich, Fed. Rep. of Germany

[21] Appl. No.: 296,846

[22] Filed: Jan. 12, 1989

Related U.S. Application Data

[63] Continuation-in-part of Ser. No. 84,413, Aug. 10, 1987, abandoned.

[30] Foreign Application Priority Data

Aug. 11, 1986 [DE] Fed. Rep. of Germany ....... 3627222

[51] Int. Cl.⁴ ........ H01L 41/08

[52] U.S. Cl. ........ 310/323; 310/317; 128/200.16; 239/102.2

[58] Field of Search ........ 310/321–325, 310/317; 239/102.2; 128/200.14, 200.16

[56] References Cited

U.S. PATENT DOCUMENTS

| | | | |
|---|---|---|---|
| 3,387,607 | 6/1968 | Gauthier et al. | 310/323 X |
| 3,561,444 | 2/1971 | Boucher | 128/200.16 |
| 3,828,773 | 8/1974 | Buch et al. | 310/317 X |
| 3,989,042 | 11/1976 | Mitsui et al. | 239/102.2 X |
| 4,109,863 | 8/1978 | Olson et al. | 239/102.2 |
| 4,294,407 | 10/1981 | Reichl et al. | 128/200.16 X |
| 4,334,531 | 6/1982 | Reichl et al. | 128/200.14 |
| 4,583,056 | 4/1986 | Takeda et al. | 310/317 X |
| 4,718,421 | 1/1988 | Rohwedder et al. | 310/325 X |
| 4,757,227 | 7/1988 | Danley et al. | 310/323 |

FOREIGN PATENT DOCUMENTS

| | | | |
|---|---|---|---|
| 2557958 | 6/1977 | Fed. Rep. of Germany . | |
| 2101500 | 1/1983 | United Kingdom | 128/200.16 |

*Primary Examiner*—Mark O. Budd
*Attorney, Agent, or Firm*—Kenyon & Kenyon

[57] ABSTRACT

An ultrasonic pocket-size atomizer comprises a housing including a first portion and a second portion detachably connected thereto. A vibration generation mechanism is mounted liquid-tight in the first portion of the housing for generating an oscillation with a frequency between 1 and 5 Mhz. The vibration generation mechanism includes a piezoelectric assembly and an electronic circuit operatively connected to the assembly for energizing the assembly and causing the assembly to vibrate. A power source including a storage battery is removably and rechargeably disposed in the first portion of the housing for supplying electric current to the electronic circuit. A cartridge is provided for containing liquid to be atomized, the cartridge being movably disposed in the second portion of the housing. An activation mechanism is provided for automatically activating the electronic circuit upon motion of the movable section of the cartridge, the activation mechanism including a magnet attached to the movable section of the cartridge so as to move therewith. The activation mechanism further includes a switch operatively connected to the electronic circuit and operable by the magnet upon a shift in the position thereof during motion of the movable section of the cartridge.

18 Claims, 3 Drawing Sheets

ULTRASONIC POCKET ATOMIZER

This is a continuation-in-part of co-pending application Ser. No. 084,413 filed on Aug. 10, 1987 now abandoned.

BACKGROUND OF THE INVENTION

This invention relates to an ultrasonic pocket-size atomizer. More in its place. particularly, this invention relates to such an atomizer which is especially useful for atomizing medication for asthma sufferers.

For many medications, it is frequently beneficial to have the patient inhale the active ingredients. This method of treatment is especially applicable to the treatment of bronchial ailments. For such treatment, many manually operable spraying and injection guns and mechanical hand atomizers are available on the market. Guns and hand atomizers, however, do not generate particularly fine distributions and require a large amount of power. In addition, the distributions produced are not homogenous. Disadvantages of applying medication with a spraying gun or aerosol can (dosing aerosols) include the absorption of heat from the patient (cold stimulation), harmful secondary effects of the propulsion gases, and the difficulties in coordinating the operation of the spray can and the inhalation of the medication owing to the very high velocity of the aerosol. These considerations apply particularly to the treatment of bronchial passages.

As disclosed in German Pat. No. 20 32 433, ultrasonic devices with piezoelectric vibration systems can be used for the atomization of liquids. Such ultrasonic devices can achieve large vibration amplitudes with relatively small amounts of electric energy and are supposed to generate very fine droplets with a relatively homogenous distribution of particle size. German Pat. No. 22 39 950 discloses the use of a piezoelectric vibration system, employing an electric excitation circuit, in a hand-held and -operated design.

German Auslegeschrift No. 25 37 765 relates to medical inhalation equipment with a piezoelectric vibration system for treating illnesses of the bronchial passages. The piezoelectric vibration system is disposed, together with low-voltage excitation electronics, in a liquid-tight housing, a sound transmitter being disposed on a vibration node line.

Presently known ultrasonic devices for the treatment of bronchial illnesses do not yet meet requirements as to dimensions, weight, energy consumption, and the distribution of droplet sizes, as well as accurate dosing of the medication.

Conventional dosing aerosols operate with a gas propellant, which is undesirable. Inhalators are also known in which capsules are filled with medicine powder ejected via an air transport stream. Such inhalators cannot be filled with several individual does. A further disadvantage of dosing aerosols operating with gas propellants in that a certain portion of the medicine particles do not enter the lungs but instead enter the esophagus, for example, Mechanical hand-operated atomizers have the particular disadvantage that a large amount of power is required for operating the pumping bulb. Moreover, preservatives are frequently added to the medication.

An object of the present invention is to provide an improved hand-held or pocket atomizer.

Another object of the present invention is to provide an atomizer for generating an aerosol suspension in which at least 50% of the aerosol droplets produced have a diameter of less than 20 μm while the majority of the droplets have a diameter in the range of 1 to 5 μm. With such particle sizes, the active ingredient of the aerosol can be effective in the tracheo-bronchial tract.

Further objects of the present invention are to provide such an atomizer in which atomization occurs with a gas propellant and without accurate dosing.

Yet another object of the present invention is to provide such an atomizer in which heat is not absorbed from tissue surfaces to which the atomized treatment medium is applied.

Yet another object of the present invention is to provide such an atomizer is which the aerosol has little or no exit velocity.

SUMMARY OF THE INVENTION

An ultrasonic pocket-size atomizer comprises, in accordance with the present invention, a housing including a first portion and a second portion, and a vibration generation mechanism mounted liquid-tight in the first portion of the housing for generating an oscillation with a frequency between 1 and 5 MHz, the vibration generation mechanism including a piezoelectric assembly and an electronic circuit operatively connected to the assembly for energizing the assembly and causing the assembly to vibrate. A power source including a storage battery is removably and rechargeably disposed in the first portion of the housing for supplying electric current to the electronic circuit. A cartridge is provided for containing liquid to be atomized, the cartridge having at least one section movably disposed in the second portion of the housing. An activation mechanism is provided for automatically activating the electronic circuit upon motion of the movable section of the cartridge, the activation mechanism including a magnet attached to the movable section of the cartridge so as to move therewith. The activation mechanism further includes a switch operatively connected to the electronic circuit and operable by the magnet upon a shift in the position thereof during motion of the movable section of the cartridge.

An ultrasonic pocket-size atomizer in accordance with the present invention enables an application of atomized substances with little noise, without cold stimulation and without the use of a gas propellant. The substance to be atomized can be dosed or measured out prior to atomization with an accuracy of greater than 95%. Such accuracy is particularly important in medical applications. An atomizer in accordance with the present invention generates an aerosol capable of suspension with a majority of the aerosol particles generated having a diameter of less than 20 μm. Moreover, the active ingredients are effective in the tracheo-bronchial tract. An atomizer in accordance with the present invention is light weight, operable independently of position or orientation, very handy and easily transportable. Refilling is accomplished simply by the exchange of cartridges. The storage battery is easily removable and rechargeable.

Pursuant to further particular features of the present invention, the first portion of the housing is removably attached to the second portion via a snap-in detent lock, and the piezoelectric assembly is mounted to the first portion by silicone rubber or is partially surrounded and attached to the first portion by injection molded synthetic resin material. In addition, the piezoelectric assembly is advantageously sealed by O-rings.

Pursuant to yet further features of the present invention, the second portion of the housing is provided with a window and an alert or alarm signal generator is operatively connected to the electronic circuit and the storage battery for generating a detectable signal indicating that the storage battery needs to be recharged. Preferably, the the alert signal generator includes a light emitting diode.

DETAILED DESCRIPTION

Figure 1:
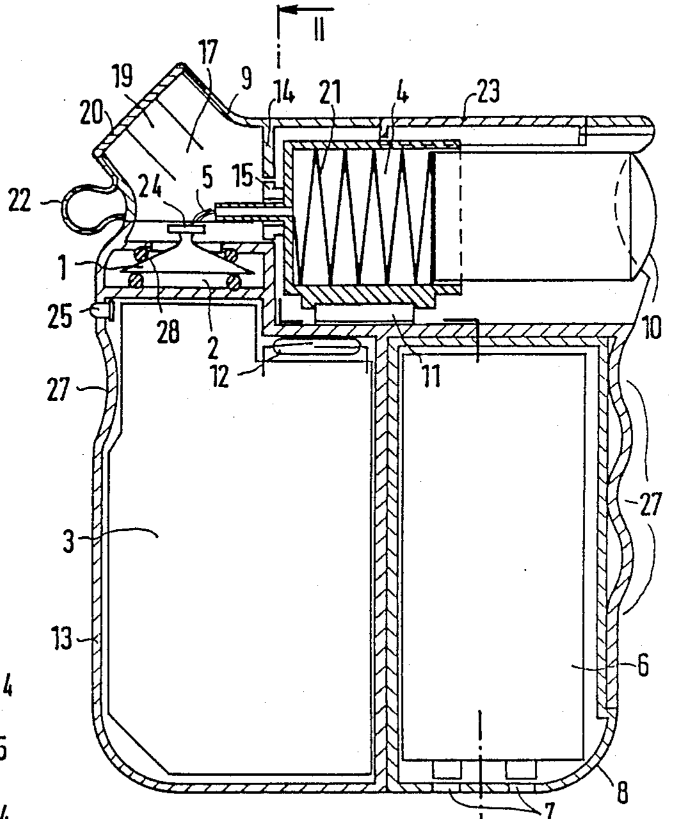
FIG. 1 is a vertical cross-sectional view of an atomizer in accordance with the present invention, showing a piezoelectric vibration system.

As illustrated in the drawing figures, an ultrasonic pocket atomizer in accordance with the present invention comprises a piezoelectric vibration system 1 having an operating frequency between 1 and 5 MHz. The piezoelectric vibration system is disposed liquid-tight in a lower portion 13 of a housing consisting of a synthetic resin such as acrylnitril butadiene-styrene coppolymers (ABS). The seal with respect to the mounting of piezoelectric vibration system 1 is achieved by embedding the system in a cast or injection molded synthetic resin material 2 such as silicone rubber. Alternatively, or additionally, the piezoelectric vibration system is mounted to lower housing portion 13 by O-rings 28.

Piezoelectric vibration system 1 is excited by an electronic circuit 3 to ultrasonic vibrations in the MHz range and atomizes a liquid medication 5 deposited on the vibration system by a cartridge 4.

Electronic circuit 3 is supplied with electric energy via a rechargeable storage battery 6. Storage battery 6 is provided with parallel contacts or terminals 7 for enabling recharging of the battery. The storage battery is preferably encased in a housing component 8 slidably mounted to lower housing portion 13 for facilitating removal of the battery and replacement thereof exemplarily to have the battery recharged while another storage battery is being used in the atomizer.

Dosing cartridge 4 is initially filled with a liquid medication and is movably mounted to an upper housing portion 9. Upon application of manual pressure to a button 10, a cartridge 4 moves towards piezoelectric vibration system 1. Simultaneously with the motion of cartridge 4, a magnet 11 attached to the cartridge closes a magnetic switch 12 attached to and encased in lower housing portion 13. Magnet 11 and switch 12 make it possible to separate lower housing portion 13 from upper housing portion 9 in a liquid-tight manner.

Switch 12 is operatively connected to electronic circuit 3 so that a closing of switch 12 by the motion of magnet 11 activates the electronic circuit which then, upon the lapse of a predetermined time interval, supplies piezoelectric vibration system 1 with excitation energy. The predetermined time interval is sufficiently long to allow the completion of an injection stroke by cartridge 4 depositing an aliquot of liquid medication 5 in an atomization chamber 17 on or about an atomizer disk 24 of piezoelectric vibration system 1.

Upon the closing of switch 12 by magnet 11 and continued motion of cartridge 4 in the direction of piezoelectric vibration system 1, an enlarged portion or body of cartridge 4 contacts a wall 14 and a plastic spring element 15 attached to the wall. Inasmuch as the resistance of spring element 15 is smaller that the resistance of a spring 21 incorporated in cartridge 4, the cartridge becomes compressed by manual pressure continued to be applied by an operator with the result that a piston (not illustrated) mounted inside cartridge 4 moves a predetermined distance towards atomizer disk 24 and thereby produces an accurate dose or droplet of medication which is deposited onto atomizer disk 24 through a small tube 55 fixed to the cartridge. Upon release of button 10 by the operator, the entire cartridge 4 returns to its rest position in response to a restoring force exerted by spring 15, while the piston (not shown) is returned to its rest position within cartridge 4 by spring 21. The medication 5 expelled at the tip of cartridge 4 is wiped off at atomizer disk 24 upon return of cartridge 4 to its rest position and is then atomized by the atomizer disk.

Plastic spring 15 is movable between the position illustrated in FIG. 1 and atomizer disk 24 but does not contact disk 24. Liquid is deposited on disk 24 through tube 55 from a reservoir located between button 10 and spring 21. Spring 21 is located between the liquid carrying portion of cartridge 4 and wall 14.

In an alternative embodiment of the invention, magnet 11 and switch 12 may be so arranged that switch 12 is actuated by magnet 11 only upon the engagement of wall 14 by cartridge 4.

Aerosol particles generated during the atomization process can be stored in a suction stub 19 and then breathed in by a user. Openings in wall 18 are provided to replenish the air removed from suction stub 19 by the inhalation. Suction stub 19 is advantageously provided with a contour matched to the mouth of a user so that the suction stub can be easily surrounded in an air-tight fit during use. The stub can terminate flush with one edge of the housing and the dimensions of the inhalator or atomizer can be maintained at a minimum.

For hygienic reasons, suction stub 19 should be closed after the inhalation process. To this end, a cover is advantageously fastened to an upper part of the atomizer, e.g., to upper housing portion 9, via a plastic film hinge 22.

Inasmuch as upper housing portion 9 can be produced inexpensively and removed easily from lower housing portion 13, hygiene can be enhanced by discarding the upper housing portion after the associated medication cartridge has been emptied. The lower housing portion is then provided with a new upper housing portion having a full medication cartridge 4.

To enable a user to know how much medication is stored in cartridge 4 after several uses, a transparent plastic window 23 is advantageously provided in upper housing portion 9. The window enables direct observation of the liquid level in cartridge 4.

Because the effective lifetime of storage battery 6 is different from the useful life of cartridge 4, a signal generator 25 is preferably in the form of a light emitting diode is operatively connected to electronic circuit 3 and concomitantly to storage battery 6 for indicating that the charge of the battery has fallen below a predetermined level. Accordingly, the failure of diode 25 to generate light upon an initial energization of electronic circuit 3 will indicate to a user that storage battery 6 must be recharged soon. Generally, the energy content of the storage battery is so large that even upon the failure of the diode signal, further atomization and application of medication is possible.

An atomizer in accordance with the present invention is provided with rounded contours at least in part for facilitating the deposition of the atomizer in a storage location by the user. Moreover, a storage container (not illustrated) for the atomizer can be designed for enabling recharging of the battery during storage of the atomizer. A preferred position and orientation of the atomizer in the storage container can be specified to account for the assymmetrical location of contacts 7.

Upper housing portion 9 is advantageously connected to lower housing portion 13 by a snap-in detent lock 16.

Although an atomizer in accordance with the present invention is particularly useful for the treatment of asthma, the atomizer can additionally be used as a room or body spraying device or as an air humidifier.

Figure 3:
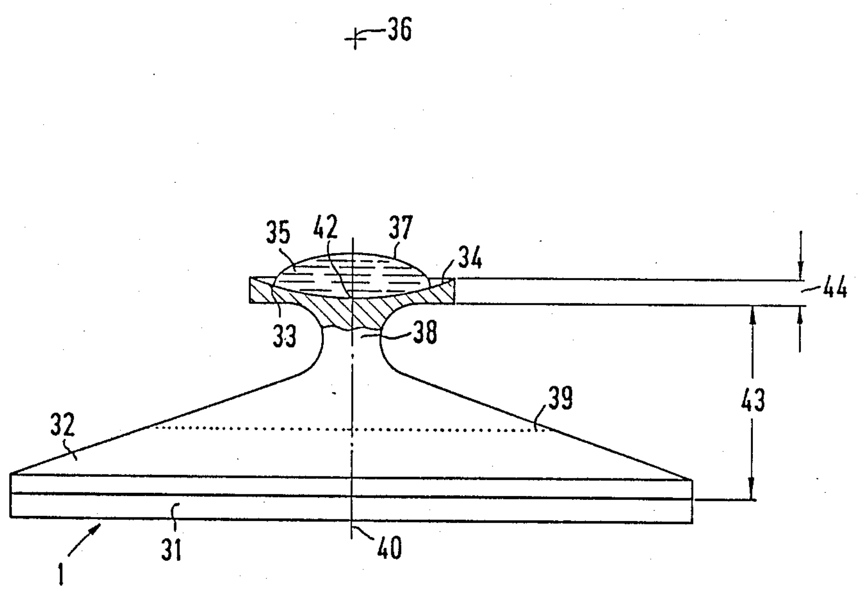
FIG. 3 is is a side elevational view, partially in cross-section and on an enlarged scale, of a piezoelectric vibration system shown in FIG. 1.

As illustrated in detail in FIG. 3, a piezoelectric vibration system 1 in a pocket-size atomizer in accordance with the present invention advantageously comprises a piezoceramic disk 31 adhesively bonded to an amplitude transformer element 32 of CrNi steel. The piezoelectric vibration system has a substantially conical shape with a neutral zone 39 in which mechanical damping does not become apparent by impedance variation. An upper portion of amplitude transformer element 32, tapering to a neck 38, bears a concave mirror member 33 of V2A (stainless) steel having a thickness denoted by reference numeral 44. Concave mirror member 33 has a cavity 34 in which liquid 35 to be atomized, exemplarily, bronchospasmalytics, is to be desposited. The deposited liquid has an outer surface 37.

As depicted in FIG. 3, the piezoelectric vibration system has an axis of symmetry 40 which intersects the surface of concave mirror member 33 at a point 42. The surface of member 33 has a focal point 36 and amplitude transformer element 32 has a height denoted by reference numeral 43.

Further structure and operation of the piezoelectric vibration system shown in FIG. 3 are set forth in U.S. patent application Ser. No. 049,129 filed May 12, 1987, the disclosure of which is hereby incorporated by reference.

Figure 2:
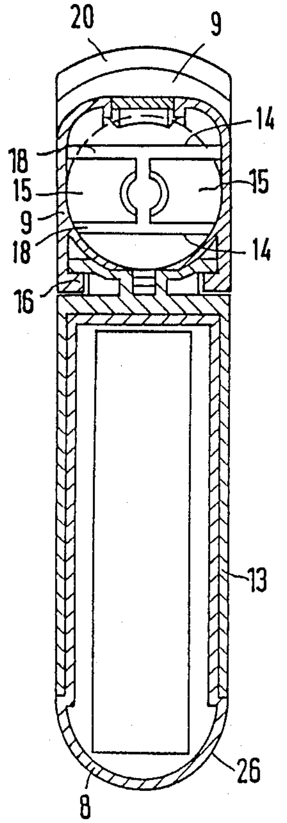
FIG. 2 is a vertical cross-sectional view taken along line II—II in FIG. 1.
Figure 4:
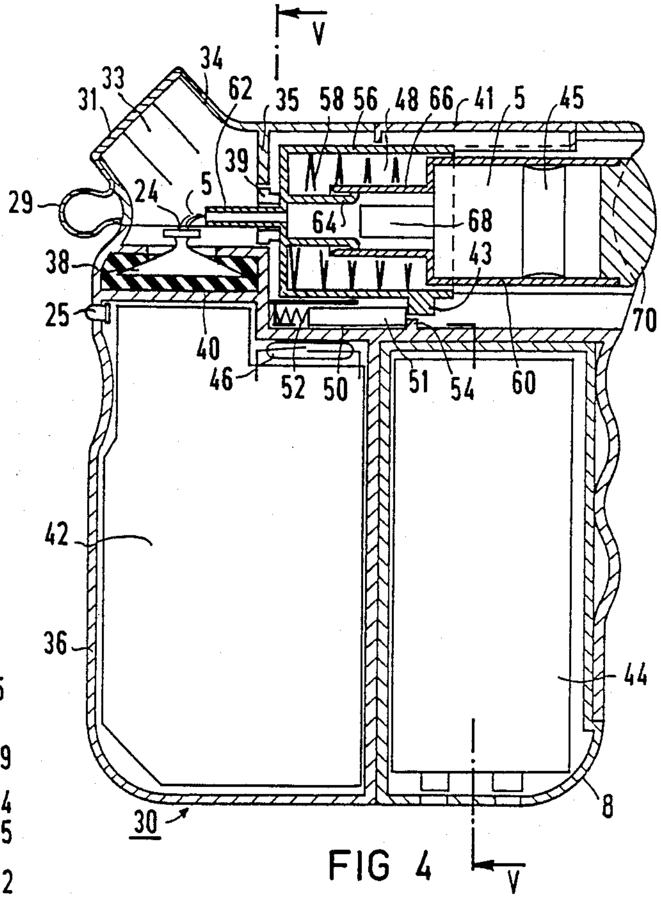
FIG. 4 is a vertical cross-sectional view of a further embodiment of an atomizer in accordance with the present invention.
Figure 5:
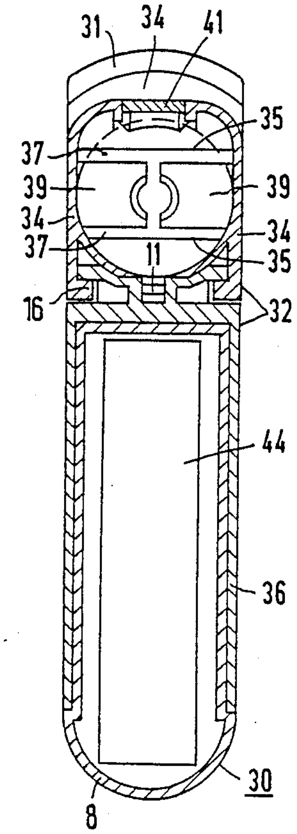
FIG. 5 is a vertical cross-section view taken along line V—V of FIG. 4.

The embodiment of the atomizer illustrated in FIGS. 4 and 5 comprises an ultrasonic pocket-size atomizer 30, which is a modified version of the embodiment of FIGS. 1 and 2. This ultrasonic pocket-size atomizer includes a plastic housing 32 with an upper housing portion 34 and a lower housing portion 36, which is exactly the same as the ultrasonic pocket-size atomizer 26 shown in FIGS. 1 and 2. The upper housing portion and the lower housing portion are connected to each other by means of a hinge 29. The vibration system is the same as the one depicted in FIGS. 1 and 3. However, it is not installed between the O-rings of a liquid-sealing lower housing portion, rather it is poured liquid-tight in a plastic substance 40, in the lower housing portion. The electronic circuit 42 and the power source 44, as well as the switch 46, built in the lower housing portion 36, and a reed contact, are left unchanged, and are the same as in the embodiment of FIGS. 1 and 2. The design of cartridge 48 differs, however, from the embodiment of FIGS. 1 and 2. The magnet is not secured to the cartridge 48, instead it is slidably supported in a groove 50 formed in the housing portion 36 which groove is arranged parallel to the slide-in direction of the cartridge. In this groove, the magnet 51 is biased by an auxiliary spring 52 opposite to the slide-in direction of the cartridge, against a limit stop 54. The upper housing portion 34 of the plastic housing 32 is also designed exactly as previously described with respect to the embodiment of FIGS. 1 and 2. Accordingly, a suction stub 33, which can be closed with a cap 31, is tip-stretched over the vibration system 38, in the upper housing portion 34. The suction stub is separated from the cavity, which accommodates the cartridge 48, by a partially open partition 35. A spring mechanism 39 for the cartridge is also situated in the partition opening 37. Above the cartridge 48, a window 41 is formed in the upper housing portion.

The cartridge 48 itself comprises a cylindrical housing 56, provided with a stop boss 43, a pressure hull 60, which can be pressed into this housing, guided in the cylindrical housing, opposite the force of a spring 58, built in the cylindrical housing, and of a spray pipe 62, attached to the front side, in the slide-in direction, of the cylindrical housing 56. Inside the cylindrical housing 56, an ejector cylinder 64 for the liquid medication 5, which is connected in series to the spray pipe 62, is provided concentrically to the spray pipe. The pressure hull 60 has a transparent design and is formed as a container for the liquid medication 5. It supports a guide tube 66 on its extremity, which extends into the cylindrical hull of the cartridge. This guide tube fits onto the ejector cylinder 64 and abuts, liquid-tight, a lip seal of the ejector cylinder. An ejecting piston 68, which can extend into the ejector cylinder 64 of the cylindrical housing, is attached in the pressure hull, concentrically to the guide tube 66 of the pressure hull 60. The rearward end of the pressure hull 60 is closed liquid tight by a control knob 70. In the interior of the pressure hull, a free-sliding piston 45 can be recognized, which separates the medication from the control knob 70.

Before the pocket atomizer is put into operation, the cartridge 48 with the pressure hull 60 is slid into the upper housing portion 34. In the embodiment of FIGS. 1 and 4, this takes place from right to left. Thereby, the spray pipe 62 is pushed through the opening of the spring mechanism 39. When the cartridge 48 is slid all the way in, the front end of the cylindrical housing 56 of the cartridge abuts the spring mechanism 39, as depicted in FIG. 4. Thereby, at the same time, the boss stop 43 of the cylindrical housing 56 of the cartridge also abuts the magnet 51. Now, if the cartridge 48 is pressed into the upper housing portion 34, by pressing on the control knob 70, then the spring mechanism 39 is pushed back, and the spray pipe 62 is shifted over the plate 24 of the vibration system 38. At the same time, the magnet 51 is shifted to the left, against the force of the auxiliary spring 52, away from the stop boss of the cylindrical housing 56 of the cartridge 48, and, in this manner, arrives above the switch 46. This switch is thereby activated, and it switches on the electronics 42 for the vibration systgem 38. During the pressing operation, in addition, the ejecting piston 68 of the pressure hull 60 slides into the ejector cylinder 64 and presses the liquid quantity of the medication found there through the spray pipe 62 on to the atomizer plate 24 of the vibration system 38, where it is atomized. When the control knob 70 is released, the pressure hull 60 is pushed out of the cylindrical housing 56 of the cartridge 48, by the spring 58, whereby, at the same time, the ejecting piston 68 of the pressure hull 60 is also drawn out of the ejector cylinder. Thereby, the free sliding piston 45 in the pressure hull 60 is drawn into the pressure hull by the amount of reduced volume. When the control knob 70 of the pressure hull is released, the entire cartridge 48 is again also pushed back by the spring mechanism 39 into its starting position, whereby the stop boss 43 releases the magnets 51. The magnet 51 is then drawn back by its auxiliary spring 52 to its starting position, as shown in FIG. 4, and brought to the seating position at the limit stop 54. Thereby, the switch 46, respectively the reed contact, is opened, and the electronics 42 are disconnected. The prevailing level of the pressure hull 60, which can be recognized, of course, by the position of the piston 45 in the transparent pressure hull 60, can be observed through the window 41.

The embodiment of FIGS. 4 and 5 has the advantage over the embodiment of FIGS. 1 and 2, in that the cartridge can be supplied without magnet and, therefore, can be manufactured less expensively. Therefore, it is more likely to be thrown out after use. The specific embodiment, according to FIGS. 1 and 2, can be manufactured less expensively, when the cartridges are refilled and used again, because the return spring 52, the guide 50, as well as the limit stop 54 for the magnet can be eliminated.

What is claimed is:

1. An ultrasonic pocket-size atomizer comprising:

a first housing;

vibration generation means mounted liquid-tight in said first housing for generating an oscillation with a frequency in the ultrasonic range said vibration generation means including a piezoelectric assembly and electronic circuit means operatively connected to said assembly for energizing said assembly and causing the piezoelectric assembly to vibrate;

power source means disposed in said first housing for supplying electric current to said electronic circuit means;

a second housing, removably mounted on said first housing;

a cartridge containing liquid to be atomized, said cartridge having at least one section movably disposed in said second housing; and activation means for automatically activating said electronic circuit means upon motion of said section of said cartridge, said activation means including a magnet arranged and configured relative to said section of said cartridge so as to move therewith, said activation means further including a switch operatively connected to said electronic circuit means and operable by said magnet upon a shift in the position thereof during motion of said section of said cartridge.

2. The atomizer defined in claim 1 wherein said first portion is removably attached to said second housing via a snap-in detent lock.

3. The atomizer defined in claim 1 wherein said piezoelectric assembly is mounted to said first housing by silicone rubber.

4. The atomizer defined in claim 1 wherein said piezoelectric assembly is partially surrounded and attached to said first housing by injection molded synthetic resin material.

5. The atomizer defined in claim 1 wherein said piezoelectric assembly is sealed by O-rings.

6. The atomizer defined in claim 1 wherein said piezoelectric assembly includes a piezoceramic disk and a metal amplitude transformer connected to one another, said amplitude transformer having an atomizer plate with a concavely shaped mirrored surface for receiving a defined quantity of liquid to be atomized.

7. The atomizer defined in claim 1 wherein said section of said cartridge is movable by manually exerted pressure.

8. The atomizer defined in claim 1 wherein said second housing is provided with a window.

9. The atomizer defined in claim 1, further comprising alerting means operatively connected to said electronic circuit means and said storage battery for generating a detectable signal indicating that said storage battery needs to be recharged.

10. The atomizer defined in claim 9 wherein said alerting means includes a light emitting diode.

11. The atomizer defined in claim 1 wherein said switch is disposed in said first housing and said magnet is disposed with said cartridge in said second housing, said first housing being sealed to be liquid impervious.

12. The atomizer defined in claim 1 wherein said piezoelectric assembly is partially surrounded and attached to said first housing by injection molded synthetic resin material, said piezoelectric assembly being sealed by O-rings.

13. The atomizer defined in claim 11 wherein said piezoelectric assembly includes a piezoceramic disk and a metal amplitude transformer connected to one another, said amplitude transformer having at an end opposite said piezoceramic disk an atomizer plate with a concavely shaped mirrored surface for receiving a defined quantity of liquid to be atomized.

14. The atomizer of claim 1 wherein said vibration generation means generates an oscillation with a frequency between 1 and 5 MHz.

15. The atomizer of claim 1 wherein said power source means comprises a storage battery removably and rechargeably disposed in said first housing.

16. The atomizer of claim 1 wherein the front end of said cartridge abuts against a spring-loaded limit stop, which spring-loaded limit stop is biased against the direction of movement of said section of the cartridge.

17. The atomizer of claim 1, wherein the magnet is permanently attached to said section of the cartridge.

18. The atomizer of claim 1, wherein the magnet is slidably mounted in a groove formed in said first housing; said cartridge including a limit stop engaging and moving the magnet against a biasing spring-like element, upon movement of said section of the cartridge to activate said switch.

* * * * *